(12) United States Patent
Carducci et al.

(10) Patent No.: US 6,773,544 B2
(45) Date of Patent: Aug. 10, 2004

(54) MAGNETIC BARRIER FOR PLASMA IN CHAMBER EXHAUST

(76) Inventors: James D. Carducci, 731 Gail Ave., Sunnyvale, CA (US) 94086; Hamid Noorbakhsh, 40327 Canyon Heights Dr., Fremont, CA (US) 94539; Evans Y. Lee, 2327 Farmcrest St., Milpitas, CA (US) 95035; Hongqing Shan, 1369 S. Stelling Rd., Cupertino, CA (US) 95014; Siamak Salimian, 958 Gerber Ct., Sunnyvale, CA (US) 94087; Paul E. Luscher, 1365 Flicker Way, Sunnyvale, CA (US) 94087; Michael D. Welch, 1169 Pineto Pl., Pleasanton, CA (US) 94566

( * ) Notice: Subject to any disclaimer, the term of this patent is extended or adjusted under 35 U.S.C. 154(b) by 552 days.

(21) Appl. No.: 09/775,173

(22) Filed: Jan. 31, 2001

(65) Prior Publication Data

US 2001/0032590 A1 Oct. 25, 2001

Related U.S. Application Data

(63) Continuation of application No. 09/557,990, filed on Apr. 25, 2000.

(51) Int. Cl.[7] .......................... H01L 21/302; C23F 1/00
(52) U.S. Cl. ............................. 156/345.1; 156/345.29; 156/345.39; 156/345.42; 156/345.46; 156/345.49; 118/723 E
(58) Field of Search .................... 156/345.39, 345.1, 156/345.29, 345.42, 345.46, 345.49; 118/723 E (56) References Cited

U.S. PATENT DOCUMENTS

| | | | |
|---|---|---|---|
| 4,438,723 A | 3/1984 | Cannella et al. | |
| 4,440,107 A | 4/1984 | Doehler et al. | |
| 4,483,737 A | 11/1984 | Mantei | |

(List continued on next page.)

FOREIGN PATENT DOCUMENTS

| | | |
|---|---|---|
| EP | 0 173 583 | 3/1986 |
| EP | 0 651 425 | 5/1995 |
| EP | 0 786 794 | 7/1997 |
| JP | 7-22389 | 1/1995 |
| JP | HEI 8-264515 | 10/1996 |

OTHER PUBLICATIONS

Quick, A.K., Chen, R.T.S., and Hershkowitz, N., "Etch rate and plasma density radial uniformity measurements in a cusped field helicon plasma etcher," *J. Vac. Sci. Technol.*, vol. 14, No. 3, May/Jun. 1996, pp. 1041–1045.

U.S. patent application Ser. No. 09/263,001, filed Mar. 5, 1999, entitled, "Magnetically Enhanced Inductively Coupled Plasma Reactor with Magnetically Confined Plasma," by Gerald Yin, et al.

U.S. patent application Ser. No. 09/521,799, filed Mar. 9, 2000, entitled, "Magnetically Enhanced Inductively Coupled Plasma Reactor with Magnetically Confined Plasma," by Gerald Yin, et al.

(List continued on next page.)

*Primary Examiner*—George A. Goudreau
(74) *Attorney, Agent, or Firm*—Law Office of Robert M Wallace; Joseph Bach (57) ABSTRACT

The invention concerns a plasma reactor employing a chamber enclosure including a process gas inlet and defining a plasma processing region. A workpiece support pedestal capable of supporting a workpiece at processing location faces the plasma processing region, the pedestal and enclosure being spaced from one another to define a pumping annulus therebetween having facing walls in order to permit the process of gas to be evacuated therethrough from the process region. A pair of opposing plasma confinement magnetic poles within one of the facing walls of the annulus, the opposing magnetic poles being axially displaced from one another. The magnetic poles are axially displaced below the processing location by a distance which exceeds a substantial fraction of a spacing between the facing walls of the annulus.

17 Claims, 4 Drawing Sheets

U.S. PATENT DOCUMENTS

| | | | |
|---|---|---|---|
| 4,810,935 A | | 3/1989 | Boswell |
| 4,829,215 A | * | 5/1989 | Kim et al. .............. 315/111.41 |
| 4,842,707 A | | 6/1989 | Kinoshita |
| 4,990,229 A | | 2/1991 | Campbell et al. |
| 4,993,361 A | | 2/1991 | Unvala |
| 5,091,049 A | | 2/1992 | Campbell et al. |
| 5,122,251 A | | 6/1992 | Campbell et al. |
| 5,160,398 A | | 11/1992 | Yanagida |
| 5,178,739 A | | 1/1993 | Barnes et al. |
| 5,224,441 A | | 7/1993 | Felts et al. |
| 5,346,579 A | | 9/1994 | Cook et al. |
| 5,401,351 A | | 3/1995 | Samukawa |
| 5,421,891 A | | 6/1995 | Campbell et al. |
| 5,429,070 A | | 7/1995 | Campbell et al. |
| 5,484,485 A | * | 1/1996 | Chapman ................ 118/723 R |
| 5,556,501 A | | 9/1996 | Collins et al. |
| 5,662,819 A | | 9/1997 | Kadomura |
| 5,830,808 A | * | 11/1998 | Chapman .................... 438/729 |
| 6,030,486 A | * | 2/2000 | Loewenhardt et al. . 156/345.46 |
| 6,054,013 A | | 4/2000 | Collins et al. |
| 6,074,518 A | * | 6/2000 | Imafuku et al. ....... 156/345.46 |
| 6,189,484 B1 | | 2/2001 | Yin et al. ................... 118/723 |
| 6,402,885 B2 | * | 6/2002 | Loewenhardt et al. . 156/345.49 |
| 6,471,822 B1 | * | 10/2002 | Yin et al. .............. 156/345.49 |
| 6,503,367 B1 | * | 1/2003 | Loewenhardt et al. . 156/345.48 |

OTHER PUBLICATIONS

U.S. patent application Ser. No. 09/773, 409, filed Jan. 31, 2001, entitled, "Magnetically Enhanced Inductively Coupled Plasma Reactor with Magnetically Confined Plasma," by Peter Loewenhardt, et al.

* cited by examiner

MAGNETIC BARRIER FOR PLASMA IN CHAMBER EXHAUST

CROSS-REFERENCE TO RELATED APPLICATION

This application is a continuation of U.S. Application Ser. No. 09/557,990, filed Apr. 25, 2000 by James Carducci et al. and entitled "Magnetic Barrier for Plasma in Chamber Exhaust".

FIELD OF THE INVENTION

The invention relates generally to plasma chambers used in processes for manufacturing semiconductors and other electronic devices. More specifically, the invention relates to apparatus and methods for preventing plasma within the chamber from extending through the exhaust passage or exhaust channel that couples the chamber to an exhaust pump.

BACKGROUND OF THE INVENTION

The series of process steps used to fabricate semiconductors and other electronic devices commonly include various plasma processes for depositing or etching films. Such plasma processes generally are performed within a vacuum chamber whose interior is maintained at a low pressure by an exhaust pump. The pump is coupled to the chamber interior via an exhaust channel.

There are several reasons that is important to prevent the plasma within the chamber from extending through the exhaust channel to the exhaust pump.

One reason is that a plasma that extends a considerable distance through the exhaust channel typically is unstable, which causes the main plasma body adjacent the workpiece to be unstable, as evidenced by visible flickering of the light emitted by the plasma. Such instability produces unacceptable non-uniformities in the plasma process.

A second reason it is important to block the plasma from extending to the exhaust pump is to protect the pump from corrosion or undesirable deposits. Any component surfaces near the plasma body within a plasma chamber generally will be corroded due to bombardment by ions from the plasma. In addition, many plasma processes have byproducts which include reactive species that can combine to form polymers or other undesirable deposits on components within the chamber that are adjacent to the plasma body. To prevent such corrosion and undesirable deposits, it is common practice to cover with removable liners the surfaces of chamber components that are exposed to or adjacent to the plasma body. The liners are replaced periodically as they become corroded.

Typically it is impractical to provide easily replaceable components for the exhaust pump. Therefore, a need exists for a plasma chamber design that prevents the plasma within the chamber from extending too close to the exhaust pump.

Commonly assigned U.S. Pat. No. 5,891,350, issued Apr. 6, 1999 to Shan et al., discloses a plasma chamber design that prevents the plasma from reaching the exhaust pump by interposing a long and sinuous exhaust passage between the chamber interior and the pump. One disadvantage of this design is that the sinuous exhaust passage creates a pressure drop between the chamber interior and the pump. In some applications, this may require an overly expensive pump to achieve a desired low chamber pressure.

SUMMARY OF THE INVENTION

The invention concerns a plasma reactor employing a chamber enclosure including a process gas inlet and defining a plasma processing region. A workpiece support pedestal capable of supporting a workpiece at processing location faces the plasma processing region, the pedestal and enclosure being spaced from one another to define a pumping annulus therebetween having facing walls in order to permit the process of gas to be evacuated therethrough from the process region. A pair of opposing plasma confinement magnetic poles within one of the facing walls of the annulus, the opposing magnetic poles being axially displaced from one another. The magnetic poles are axially displaced below the processing location by a distance which exceeds a substantial fraction of a spacing between the facing walls of the annulus.

The invention further concerns a chamber enclosure having a process gas inlet and defining a plasma processing region. A workpiece support pedestal capable of supporting a workpiece at processing location facing the plasma processing region, the pedestal and enclosure being spaced from one another to define a pumping annulus therebetween having facing walls, to permit process gas to be evacuated therethrough from the process region. A pair of opposing plasma confinement magnetic poles within one of the facing walls of the annulus, the opposing magnetic poles being axially displaced from one another. The magnetic poles are axially displaced below the processing location by a distance which is sufficient so that the magnetic field adjacent the workpiece plane is on the order of about 50 times less than the magnetic field across the annulus adjacent the magnetic poles.

DETAILED DESCRIPTION OF THE PREFERRED EMBODIMENTS

1. Conventional Chamber Components

Figure 1:
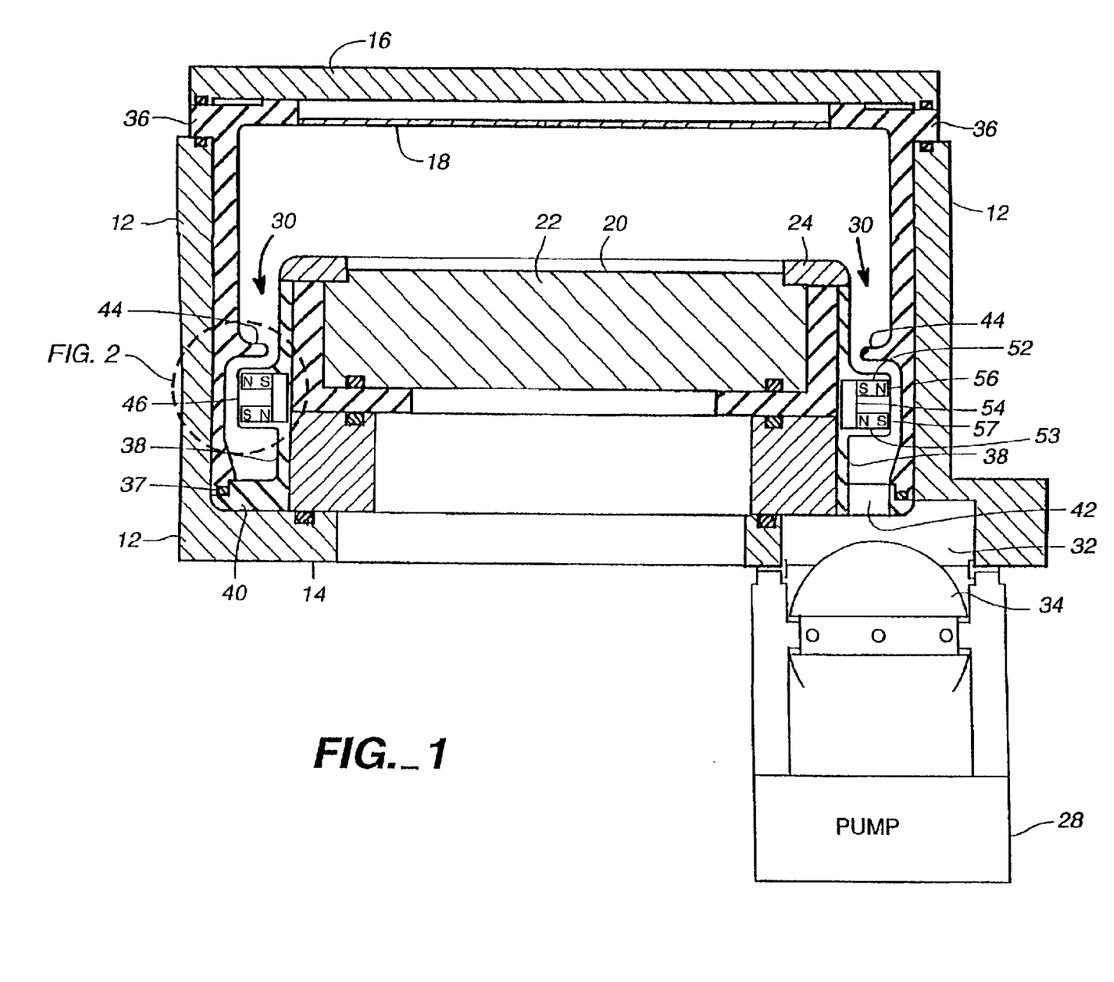
FIG. 1 is a plan view of a plasma etching chamber with an exhaust manifold having an annular, U-shaped magnet system embedded within an annular protrusion according to the invention.

FIG. 1 shows one embodiment of the invention as applied to a plasma chamber suitable for either etching or chemical vapor deposition (CVD). The conventional components of the chamber will be described before describing the novel features for preventing the plasma from reaching the exhaust pump.

The illustrated chamber is cylindrical because it is adapted for processing a circular workpiece such as a semiconductor wafer. Alternatively, a chamber for processing a rectangular substrate conventionally would have a rectangular transverse cross section.

A cylindrical side wall 12, circular bottom wall 14, and annular top wall or lid 16 provide a vacuum tight enclosure for the chamber interior. A gas distribution plate 18, also called a diffuser or shower head, is mounted at the bottom of the lid 16. The gas distribution plate is perforated to function as a gas inlet through which process gases enter the chamber. The side wall 12 may be either dielectric or metal. If the side wall is metal, it will function as an electrically grounded electrode unless it is covered by sufficiently thick dielectric as explained below.

The semiconductor wafer or other workpiece 20 is mounted on, or immediately above, a disc-shaped metal susceptor or pedestal 22, which, in turn, is mounted in the lower end of the chamber. The workpiece 20 typically is clamped or held against the upper surface of the susceptor 22 by a conventional chuck such as a mechanical clamping ring or an electrostatic chuck (not shown).

A vacuum pump 28 exhausts gases from the chamber through annular exhaust manifold 30 and cylindrical pumping channel 32 so as to reduce the total gas pressure in the chamber to a level suitable for the plasma process intended to be performed in the chamber, typically in the range of 10 millitorr to 20 torr, with pressures at the lower and higher ends of the range being typical for etching and CVD processes, respectively. A throttle valve 34 is mounted within the pumping channel 32. The throttle valve regulates the gas pressure within the chamber by controlling the impedance to gas flow within the pumping channel, thereby controlling the pressure drop across the pumping channel as required to maintain the desired chamber pressure.

In a capacitively coupled plasma chamber such as the one illustrated in FIG. 1, energy is coupled to the plasma by a radio frequency (RF) power supply connected directly to an electrode within the chamber. Typically, the gas distribution plate 18 and the susceptor 22 are electrically connected so as to function as anode and cathode electrodes, respectively. Specifically, the RF power supply, not shown, is connected to either the anode electrode 18 (commonly for plasma CVD) or to the cathode electrode 22 (commonly for reactive ion etching). The other electrode may be connected to a second electrical power supply, or else it may be electrically grounded. The RF power supply provides an RF voltage between the cathode and anode electrodes that excites the gases within the chamber into a plasma state.

As an alternative to capacitive coupling, any other conventional means may be used to couple energy to the gases within the chamber to form a plasma. For example, RF power may be inductively coupled to the chamber interior, or microwave power may be coupled via a microwave wave guide connected to the chamber.

Surfaces of chamber components that are exposed to the plasma within the chamber generally suffer corrosion or an accumulation of undesirable residue during operation of the plasma chamber. To minimize the need to clean or replace major chamber components, such components commonly are covered by a liner or shield that is easily removable for cleaning or replacement. Specifically, in the preferred embodiment shown in FIG. 1, the chamber side wall 12 is covered by a first cylindrical liner or shield 36, also called the outer liner or outer shield. The cylindrical outer wall of the susceptor 22 is covered by a second cylindrical liner or shield 38, also called the inner liner or susceptor shield. In addition, a workpiece shield ring 24 rests on and covers the portion of the top surface of the susceptor that is outside the perimeter of the wafer 20.

The inner liner 38 includes an annular flange 40 that extends radially outward from the lower end of the inner liner 38 and rests on the chamber bottom wall 14. The flange 40 covers and protects the surface of the chamber bottom wall that otherwise would be exposed to the interior of the exhaust manifold 30. The inner liner 38 is held in place by the weight of the outer dielectric liner 36. An O-ring 37 provides a seal between the inner and outer liners.

Each of the shields 36, 38 and 24 should be resistant to corrosion by the plasma and by the gas chemistries anticipated to be used in the chamber. In the illustrated plasma chamber used for reactive ion etching, the outer and inner liners 36 and 38 are anodized aluminum and the workpiece shield ring 24 is quartz.

However, the bottom surface of the flange 40 is bare aluminum rather than being anodized. The bare aluminum provides consistently good electrical contact between the inner liner 38 and the electrically grounded chamber bottom wall 14, thereby providing more consistent performance of the semiconductor fabrication process performed in the chamber than would be possible if an anodized bottom surface of flange 40 provided inconsistent electrical contact. Alternatively, as explained below, it may be desirable to fabricate the susceptor shield of dielectric material. In that case, there would be no issue of inconsistent electrical contact with the inner liner.

O-ring 37 can stick to the outer and inner shields 36 and 38, making it difficult to separate the shields when they are being replaced. If so, the sticking can be prevented by placing a thin, aluminum ring (not shown) between the O-ring 37 and the bottom of the outer shield 36.

The anodization on the surface of the outer and inner shields 36 and 38 is a thin dielectric that reduces somewhat the RF current flow between the plasma and the metal surfaces covered by the shields. An even greater reduction in such current flow may be desirable in order to concentrate the plasma in the region adjacent the workpiece 20. This can be accomplished by fabricating the shields entirely of dielectric material such as quartz rather than anodized aluminum.

The inner liner 38 and the lower half of the outer liner 36 respectively function as the inner and outer walls of the annular exhaust manifold 30. The annular flange 40 at the bottom of the inner liner 38 includes an arcuate aperture 42, aligned with the cylindrical pumping channel 32, to permit exhaust gases to flow from the annular exhaust manifold, through the flange aperture 42, and then through the cylindrical pumping channel 32 to the throttle valve 34 and the pump 28.

The various chamber components described above are described in more detail in commonly assigned U.S. Pat. No. 5,891,350, issued Apr. 6, 1999 to Shan et al., the entire content of which is hereby incorporated by reference into this patent specification.

The exhaust channel of the illustrated chamber includes an annular exhaust manifold and a cylindrical pumping channel. The annular exhaust manifold is coaxial with the chamber interior and extends around all or most of the azimuth of the chamber interior. The cylindrical pumping channel is coupled to the exhaust manifold at one azimuthal position. Some conventional plasma chambers include an annular exhaust manifold coupled directly to the exhaust pump without any intermediate pumping channel. Other conventional plasma chambers couple the pump to the chamber interior using only a pumping channel that does not extend around the azimuth of the chamber interior. In this patent specification, the term "exhaust channel" or "exhaust passage" encompasses either an annular exhaust manifold or a pumping channel, or the two in combination.

2. Exhaust Channel and Magnet for Confining Plasma

Figure 2:
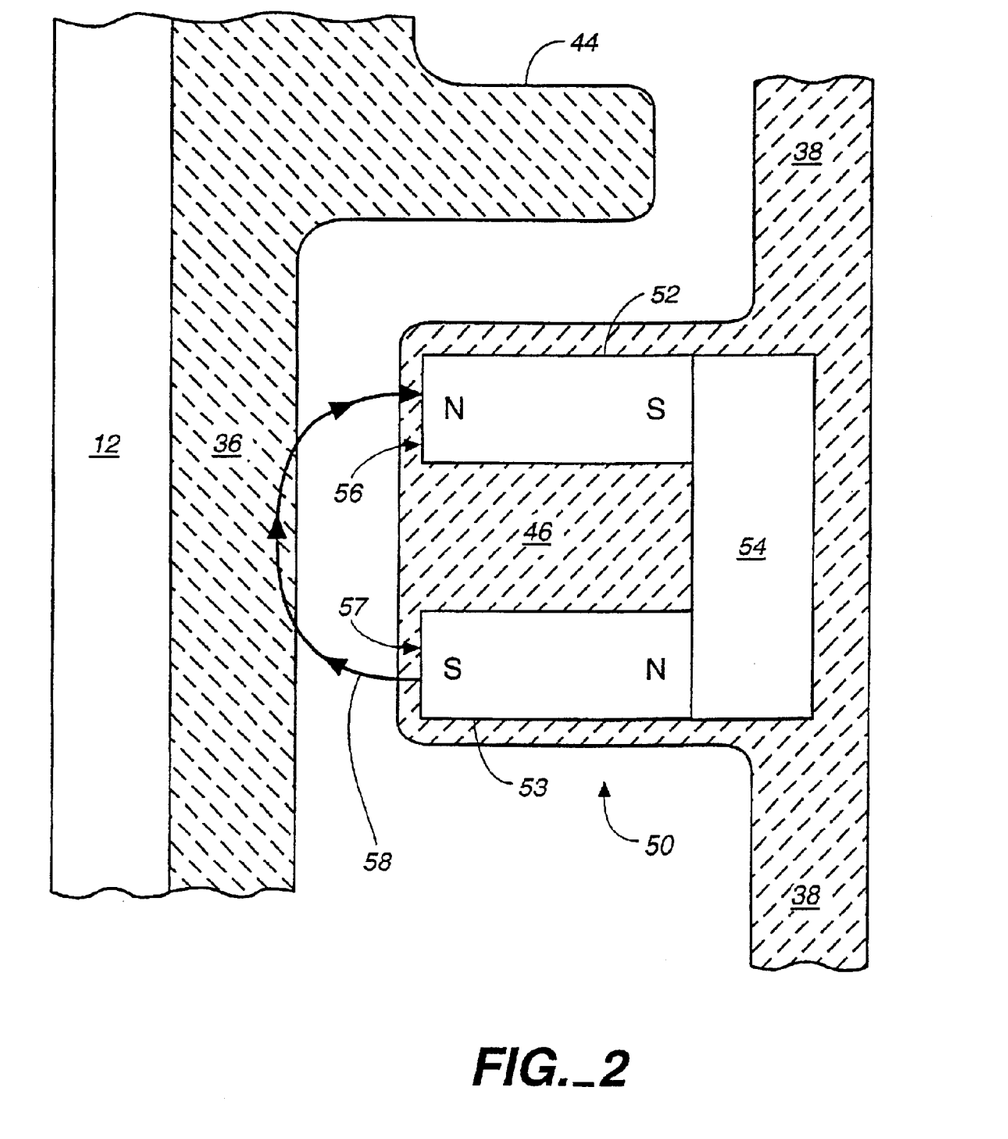
FIG. 2 is a detail of the magnet system and annular protrusions in the FIG. 1 chamber.
Figure 3:
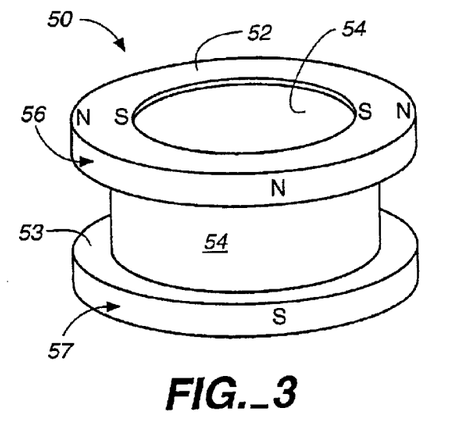
FIG. 3 is a perspective view of an annular, U-shaped magnet system with magnetic poles facing radially outward.

The preferred embodiment of the invention, shown in FIGS. 1–3, employs two features—a gas flow deflector 44, 46 and a magnet system 50—that operate synergistically to prevent the plasma body within the chamber interior from reaching the exhaust pump.

Specifically, the interior of the exhaust manifold 30 includes at least one deflector 44, 46 that deflects at least a substantial portion of the exhaust gases transversely, instead of allowing all of the exhaust gases to flow in an unobstructed straight path through the exhaust manifold. (By "transversely" we mean perpendicular to the direction of the path along which the gases would flow in the absence of the deflector.)

The deflector creates turbulence in the flow of exhaust gases that increases the rate of collisions of reactive species in the gases with the deflector and with the walls of the exhaust manifold near the deflector. The collisions promote surface reactions among the reactive species so as to produce deposits on the walls. This depletes the exhaust gases of the reactive species that tend to produce such deposits, thereby greatly reducing or eliminating the concentration of such reactive species in the exhaust gases downstream of the deflector, and therefore greatly reducing or eliminating undesirable deposits on the throttle valve 34 and pump 28.

The deflector also increases the rate of collisions of charged particles in the exhaust gases so as to promote recombination of such charged particles, thereby reducing the concentration of charged particles in the exhaust gases.

Additionally, a magnet system 50 (52–57) is positioned near the deflector 44, 46 so as to produce a magnetic field within the exhaust manifold near the deflector. The magnetic field preferably has a substantial component directed transverse to the direction of exhaust gas flow through the manifold. The transverse component of the magnetic field transversely deflects moving electrons so that they are more likely to recombine with positive ions, thereby reducing the concentration of charged particles in the exhaust gases.

Since the deflector and the magnetic system both reduce the concentration of charged particles in the exhaust gases, the two in combination can reduce the concentration sufficiently to extinguish the plasma downstream of the deflector and magnet system. Specifically, the magnetic field should be strong enough, and the turbulence caused by the one or more deflectors should be great enough, so that the combined effects of the magnetic field and the deflector prevent the plasma body within the chamber from reaching the throttle valve 34 and exhaust pump 28.

The plasma confinement effect of the magnetic field permits the use of a wider and/or less sinuous exhaust channel than would be required to block the plasma without the magnetic field. Therefore, the pressure drop across the exhaust channel can be reduced in comparison with prior art designs that rely entirely on the sinuousness of the exhaust manifold to block the plasma.

In the preferred embodiment shown in FIGS. 1–3, the deflector consists of two coaxial, annular protrusions 44, 46 extending into the gas passageway of the exhaust manifold 30 from the walls of the manifold. The upper protrusion 44 extends radially inward from the outer dielectric liner 36, and the lower protrusion 46 extends radially outward from the inner dielectric liner or cathode shield 38. Because the two protrusions overlap each other radially, they do not permit any of the exhaust gases to travel in a straight line through the exhaust manifold, thereby maximizing the likelihood that reactive species in the exhaust gases will collide with either the protrusions or the walls of the exhaust manifold.

We define a "magnet system" as one or more magnets in combination with zero, one or more magnetically permeable pole pieces to form a magnetic circuit having a north pole and a south pole. In the preferred embodiment of FIGS. 1–3, the magnet system 50 consists of two annular magnets 52, 53 mounted coaxially with the annular exhaust manifold 30 and spaced apart along the axis of the manifold. The two annular magnets are identical, except that the first magnet 52 has its north and south poles at its radially inner and outer ends, respectively, whereas the second magnet 53 has its north and south poles at its radially outer and inner ends, respectively. The magnet system 50 also includes a cylindrical, magnetically permeable pole piece 54 mounted coaxially with the two magnets 52, 53 so as to abut and extend between the radially inner ends of the two magnets, thereby completing a magnetic path or "magnetic circuit" between the two magnets.

Consequently, the north pole 56 of the magnet system 50 is the north pole of the first annular magnet 52, i.e., the pole of the first magnet opposite the pole that abuts the pole piece 54. The south pole 57 of the magnet system 50 is the south pole of the second annular magnet 53, i.e., the pole of the second magnet opposite the pole that abuts the pole piece 54.

The magnet system 50 preferably is mounted within the lower protrusion so that the ends of the north and south poles 56, 57 of the magnet system are as close as possible to the narrow portion of the gas passageway within the exhaust manifold that is radially outward of the protrusion. Mounting the magnet system close to the narrowest portion of the exhaust manifold passageway is desirable to maximize the magnetic field strength to which the exhaust gases are subjected.

The preferred implementation of the magnet system just described has a U-shaped cross section as shown in FIGS. 1–3, with the base of the "U" pointing radially inward and the open end of the "U" pointing radially outward. More specifically, the shape of the magnet system is that of a U-shaped horseshoe magnet that is revolved around the longitudinal axis of the chamber.

The magnetic field pattern produced by this U-shaped magnet system, represented by field line 58 in FIG. 1, is desirable because it is concentrated primarily within the passageway of the exhaust manifold. This concentration has at least two advantages. One advantage is that, as stated above, it maximizes the magnetic field strength to which the exhaust gases are subjected, thereby maximizing the effectiveness of the magnet in extinguishing the plasma downstream of the magnet.

A second advantage of the U-shaped magnet system is that the magnetic field strength declines rapidly along the longitudinal axis of the chamber, so that the magnetic field strength is low at the workpiece 20. To minimize the risk of damaging the workpiece by ion bombardment or electrostatic charge accumulation, the magnetic field strength at the workpiece should be as low as possible, preferably no greater than 5 gauss, and more preferably no greater than 3 gauss. The magnet system is mounted in the lower protrusion rather than the upper protrusion in order to position the magnet system as far as possible from the workpiece 20, thereby minimizing the strength of the magnetic field at the workpiece.

Figure 4:
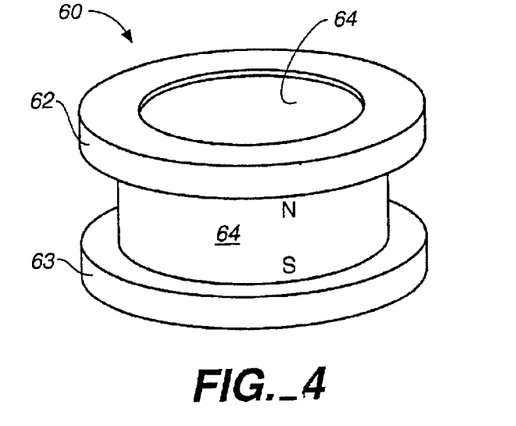
FIG. 4 is a perspective view of a magnet system whose magnets and pole pieces are interchanged relative to the embodiment of FIG. 3.

FIG. 4 shows an alternative magnet system 60 whose magnets and pole pieces are interchanged relative to the embodiment of FIGS. 1–3. Specifically, the upper and lower annular members 62, 63 are magnetically permeable pole pieces rather than magnets. The cylindrical member 64 is a magnet rather than a pole piece, the cylindrical magnet having a north magnetic pole at the upper end of its longitudinal axis abutting the upper pole piece 62 and a south magnetic pole at the lower end of its axis abutting the lower pole piece 63.

A possible alternative implementation of the exhaust manifold could omit the upper protrusion 44, relying on the combination of the lower protrusion 46 and the magnet system 50 to block the plasma.

Figure 5:
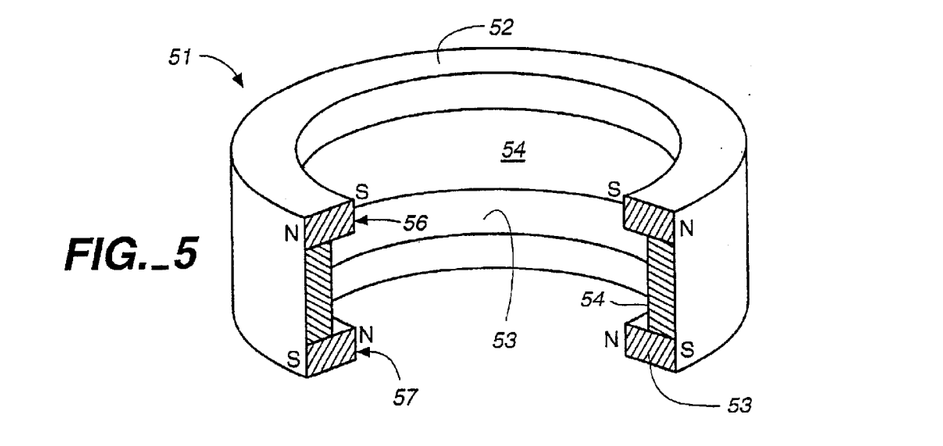
FIG. 5 is a perspective view of an annular, U-shaped magnet system with magnetic poles facing radially inward.

Another alternative exhaust manifold design would omit the lower protrusion 46 (which extends radially outward from the inner liner 38) and substitute a modified magnet system 51, shown in FIG. 5, that is mounted within the upper protrusion 44 (which extends radially inward from the outer liner 36). The north and south magnetic poles 56, 57 of the modified magnet system 51 should be adjacent the gas passageway at the radially inner end of the protrusion 44. This can be accomplished using the same magnets 52, 53 and pole piece 54 as in the FIG. 3 magnet system, but with the pole piece 54 moved from the radially inner end to the radially outer end of the two magnets, as shown in FIG. 5.

Figure 6:
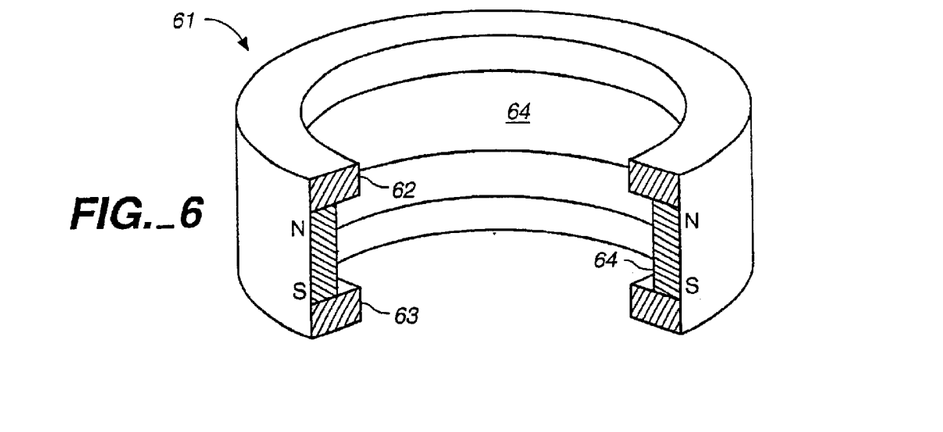
FIG. 6 is a perspective view of a magnet system whose magnets and pole pieces are interchanged relative to the embodiment of FIG. 5.

FIG. 6 shows an alternative magnet system 61 that differs from the FIG. 5 magnet system 51 in that the magnets and pole pieces are interchanged. (See the preceding discussion of the FIG. 4 embodiment.)

Figure 7:
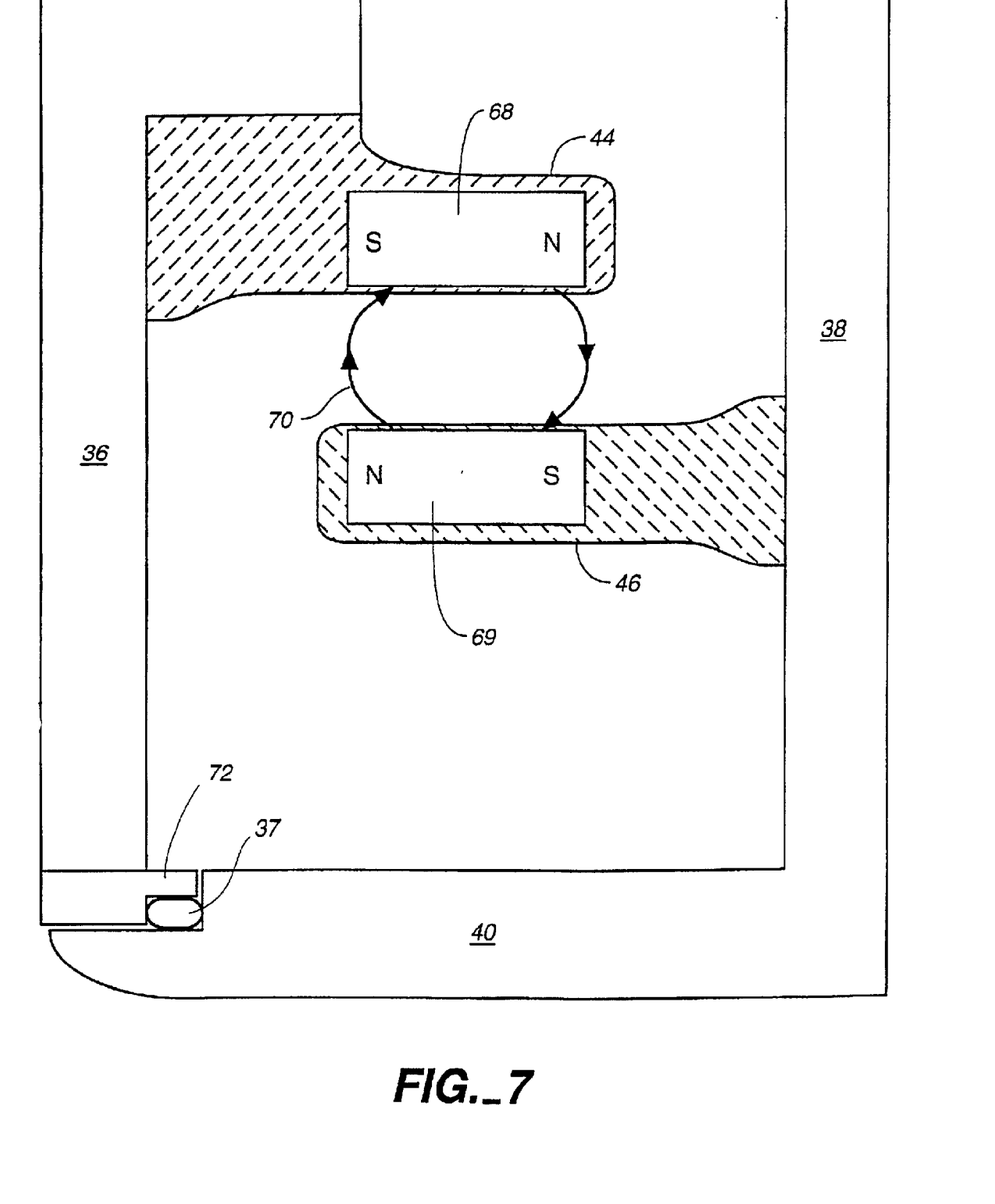
FIG. 7 is a detailed plan view of an exhaust manifold having two annular magnets respectively embedded within two annular protrusions according to the invention.

We also tested the exhaust manifold design shown in FIG. 7 in a plasma chamber that otherwise was identical to the chamber shown in FIG. 1. The exhaust manifold of FIG. 7 includes upper and lower annular magnets 68, 69 mounted within the upper and lower protrusions 44, 46, respectively, of the exhaust channel. The upper magnet 68 has north and south poles at its radially inner and outer ends, respectively. The lower magnet 69 has north and south poles at its radially outer and inner ends, respectively. Consequently, the north and south poles of the upper magnet are aligned with the south and north poles of the lower magnet. The resulting magnetic field, depicted by magnetic field lines 70, is highly concentrated in the region of the exhaust manifold channel or passageway between the two protrusions. As explained in the preceding discussion of the FIG. 1 embodiment, such concentration is desirable to maximize the strength of the magnetic field to which the exhaust gases are subjected and to minimize the magnetic field at the workpiece 20.

To facilitate testing the FIG. 7 embodiment with different gaps between upper and lower protrusions 44, 46, our prototype included an annular dielectric spacer 72 below the outer dielectric liner 36. By substituting a thicker spacer 72, we could increase the height of the upper protrusion 44 and thereby increase the gap between the two protrusions. We used the same magnets 68, 69 for every spacer thickness we tested. Therefore, when we substituted a thicker spacer, we both increased the gap and decreased the magnetic field strength in the gap.

In these tests we found that the plasma was successfully blocked from extending below the lower protrusion when the gap between the upper and lower protrusion was 0.5 inch or less and the magnetic field strength in the gap was at least 100 or 150 gauss. We also found that, in the illustrated chamber, the magnetic field strength declined fast enough away from the magnets so that the magnetic field strength at the workpiece position 20 was less than 3 gauss, which we consider low enough to avoid risk of damage to the workpiece. However, when we tested a wider gap between the two protrusions, and therefore a lower magnetic field strength in the gap, we found that the plasma was not successfully blocked.

We currently prefer the FIG. 1 embodiment because more manufacturing labor is required to mount magnets within two protrusions as in the FIG. 7 design in comparison with mounting magnets in only one protrusion as in the FIG. 1 design.

In an alternative implementation that omits the outer dielectric liner 36, the chamber side wall could function as the outer wall of the annular exhaust manifold. The chamber wall could include an inward-extending protrusion 44.

Another alternative embodiment of the exhaust manifold would be to omit one protrusion and its corresponding magnet from the FIG. 7 embodiment. We tested a prototype that was identical to the one shown in FIG. 7, except that the upper protrusion 44 and the upper magnet 68 was omitted. While this prototype successfully, blocked the plasma from extending below the lower protrusion, we considered the magnetic field at the workpiece to be undesirably strong. However, this embodiment might be suitable for use in semiconductor fabrication processes in which the workpiece is not overly susceptible to damage by ion bombardment or electrostatic charge accumulation.

More generally, the deflector 44, 46 need not be one or more protrusions extending from the walls of the exhaust channel, but can be any structure within the exhaust channel that causes substantial turbulence in the exhaust gases. As described earlier, such turbulence will promote recombination of charged particles so as to help extinguish the plasma downstream of the turbulence, and it will promote surface reactions among reactive species so that reaction products will be deposited on surfaces near the deflector rather than on pumping components 28, 34 downstream.

The deflector and magnet system can be mounted in any part of the exhaust channel, such as the pumping channel 32, even though they are mounted in the annular exhaust manifold in the preferred embodiment.

Of course, any materials between the magnet system and the interior of the exhaust channel should be non-magnetic so as to avoid blocking the magnetic field from reaching the exhaust gases. As stated earlier, in the preferred embodiment the protrusions in which the magnet system is mounted are anodized aluminum.

To equalize the exhaust gas flow rate around the azimuth of the chamber, it is preferable to slightly reduce the radial width of the exhaust manifold near the azimuth of the pumping channel and to slightly increase its radial width near the opposite azimuth, i.e., near the azimuth 180 degrees away from the pumping channel.

The directions of the magnetic fields can be reversed without affecting the operation of the invention. Therefore, all references to north and south poles can be interchanged.

The illustrated plasma chamber has circular symmetry because it is intended for processing a a single, circular semiconductor wafer. In plasma chambers having other geometries, such as chambers for processing multiple substrates or rectangular substrates, the components of the invention such as the deflector and magnet system would be expected to have rectangular or more complex geometries. The term "annular" as used in this patent specification is not intended to limit the described shape to one having a circular inner or outer perimeter, but encompasses rectangular and more complex shapes.

What is claimed is:

1. A plasma reactor comprising:
   a chamber enclosure having a process gas inlet and defining a plasma processing region;
   a workpiece support pedestal capable of supporting a workpiece at processing location facing said plasma processing region, said pedestal and enclosure being spaced from one another to define a pumping annulus therebetween having facing walls, to permit process gas to be evacuated therethrough from the process region;
   a pair of opposing plasma confinement magnetic poles within one of said facing walls of said annulus, the opposing magnetic poles being axially displaced from one another;
   said magnetic poles being axially displaced below said processing location by a distance which exceeds a spacing between said facing walls of the annulus.

2. The reactor of claim 1 further comprising
   a connector of magnetic material within said one wall connecting the opposing poles.

3. The reactor of claim 1 wherein the one wall of the annulus comprises a removable liner, and wherein said poles are within said removable liner.

4. The reactor of claim 2 wherein said magnetic poles are ring shaped and are concentric with said annulus and wherein said connector is ring shaped and concentric with said annulus, whereby the opposing poles and the connector define a cylindrical horseshoe magnet.

5. The reactor of claim 2 wherein said connector is formed separately from said opposing magnetic poles, and wherein said connector is magnetized and said magnetic poles comprise magnetically permeable material.

6. The reactor of claim 2 wherein said connector is formed separately from said opposing magnetic poles, and wherein said magnetic poles comprise magnetized material and said connector comprises magnetically permeable material.

7. The reactor of claim 1 wherein said one wall is an inner wall.

8. The reactor of claim 1 wherein said one wall is an outer wall.

9. The reactor of claim 1 wherein the axial displacement below the processing location is several times the spacing between said facing walls.

10. The reactor of claim 1 wherein the axial displacement of said magnetic poles below said processing location is sufficient so that the magnetic field near the processing location is on the order of about 50 times less than the magnetic field across said annulus on the vicinity of the magnetic poles.

11. The reactor of claim 10 wherein the magnetic field at the processing location is near or less than about 3 Gauss and within the annulus is near or greater than about 150 Gauss.

12. The reactor of claim 1 in which the opposite poles are oriented such that they provide their maximum magnetic flux in the direction across the annulus.

13. The reactor of claim 12 which the opposite poles comprise a horseshoe magnet.

14. The reactor of claim 13 in which the opposite poles are connected by a magnetically permeable connector.

15. The reactor of claim 1 which further includes a horseshoe magnet arrangement having a pair of legs respectively terminating in said opposite poles, with at least one ring magnet comprising one leg of the horseshoe arrangement, and with the remainder of the arrangement being of magnetically permeable material.

16. A plasma reactor comprising:
    a chamber enclosure having a process gas inlet and defining a plasma processing region;
    a workpiece support pedestal capable of supporting a workpiece at processing location facing said plasma processing region, said pedestal and enclosure being spaced from one another to define a pumping annulus therebetween having facing walls, to permit process gas to be evacuated therethrough from the process region;
    a pair of opposing plasma confinement magnetic poles within one of said facing walls of said annulus, the opposing magnetic poles being axially displaced from one another;
    said magnetic poles being axially displaced below said processing location by a distance which is sufficient so that the magnetic field adjacent the workpiece plane is on the order of about 50 times less than the magnetic field across said annulus adjacent the magnetic poles.

17. A plasma reactor comprising:
    a chamber enclosure having a process gas inlet and defining a plasmas processing region;
    a workpiece support pedestal capable of supporting a workpiece at processing location facing said plasma processing region, said pedestal and enclosure being spaced from one another to define a pumping annulus therebetween having facing walls, to permit process gas to be evacuated therethrough from the process region;
    a pair of opposing plasma confinement magnetic poles within one of said facing walls of said annulus, the opposing magnetic poles being axially displaced from one another;
    said poles being displaced from said processing location by a distance substantially greater than the smallest distance across said annulus, said poles being oriented to provide maximum magnetic flux across said annulus and a minimum of said flux adjacent said processing location.

* * * * *